US009293481B2

(12) United States Patent
Wu (10) Patent No.: US 9,293,481 B2
(45) Date of Patent: *Mar. 22, 2016

(54) ARRAY SUBSTRATE, AND DUAL VIEW FIELD DISPLAY DEVICE AND MANUFACTURING METHOD THEREOF (71) Applicant: BOE Technology Group Co., Ltd., Beijing (CN)

(72) Inventor: Yanbing Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 136 days.

This patent is subject to a terminal disclaimer.

(21) Appl. No.: 13/994,740

(22) PCT Filed: Dec. 23, 2012

(86) PCT No.: PCT/CN2012/087238
§ 371 (c)(1),
(2) Date: Jun. 16, 2013

(87) PCT Pub. No.: WO2013/117109
PCT Pub. Date: Aug. 15, 2013

(65) Prior Publication Data
US 2014/0146261 A1 May 29, 2014

(30) Foreign Application Priority Data

Feb. 9, 2012 (CN) .......................... 2012 1 0029090
Mar. 12, 2012 (CN) .......................... 2012 1 0063694

(51) Int. Cl.
G02B 27/22 (2006.01)
G02F 1/1335 (2006.01)
(Continued)

(52) U.S. Cl.
CPC .......... H01L 27/124 (2013.01); G02F 1/13624 (2013.01); G02F 1/134309 (2013.01);
(Continued)

(58) Field of Classification Search
CPC ..................... G02B 27/2214; G02F 1/133526; G02F 1/134309; G02F 1/13624; G02F 2001/134372; H01L 27/3267; H01L 51/50; H01L 51/5012; H01L 2227/32; H01L 2251/566; H01L 2924/12044; H01L 27/3225
USPC ............... 349/15, 141, 187; 348/51; 353/7, 8; 345/419, 6

See application file for complete search history.

(56) References Cited

U.S. PATENT DOCUMENTS 8,378,944 B2 2/2013 Jeong et al.
2006/0012593 A1* 1/2006 Iriguchi et al. ................ 345/204
(Continued)

FOREIGN PATENT DOCUMENTS

CN 1721961 A 1/2006
CN 101547375 A 9/2009
(Continued)

OTHER PUBLICATIONS

International Preliminary Report on Patentability for International Application No. PCT/CN2012/087238 dated Aug. 12, 2014, 11pgs.
(Continued)

Primary Examiner — Thanh-Nhan P Nguyen
Assistant Examiner — Jia Pan (57) ABSTRACT An array substrate, and a dual view field display device and a manufacturing method thereof are disclosed. The array substrate includes: a plurality of pixel units defined by gate lines and data lines which intersect each other, each of the pixel units including a pixel electrode and a TFT circuit; the pixel electrode of each of the pixel units comprises at least two first pixel electrodes and at least two second pixel electrodes, which are spaced from each other; the TFT circuit of each of the pixel units comprises a first sub-TFT circuit connected to the first pixel electrodes and a second sub-TFT circuit connected to the second pixel electrodes. According to the above array substrate, a dual view barrier can be produced within the display device, and the production costs can be reduced.

14 Claims, 7 Drawing Sheets (51) Int. Cl.
| | |
|---|---|
| *G02F 1/1343* | (2006.01) |
| *G02F 1/1362* | (2006.01) |
| *H01L 51/50* | (2006.01) |
| *H01L 27/12* | (2006.01) |
| *H01L 27/32* | (2006.01) |

(52) U.S. Cl.
CPC ...... *G02F1/134363* (2013.01); *H01L 27/1288* (2013.01); *H01L 27/3267* (2013.01); *G02F 1/133512* (2013.01); *H01L 51/50* (2013.01)

(56) References Cited

U.S. PATENT DOCUMENTS

| | | | | |
|---|---|---|---|---|
| 2007/0008315 | A1* | 1/2007 | Song et al. | 345/419 |
| 2008/0002079 | A1* | 1/2008 | Kimura | 349/42 |
| 2009/0243961 | A1* | 10/2009 | Momose | 345/1.3 |
| 2009/0279005 | A1 | 11/2009 | Fukushima et al. | |
| 2009/0279036 | A1* | 11/2009 | Kim et al. | 349/139 |
| 2009/0309822 | A1* | 12/2009 | Jeong et al. | 345/92 |
| 2009/0309958 | A1* | 12/2009 | Hamagishi et al. | 348/54 |
| 2010/0245222 | A1* | 9/2010 | Cho et al. | 345/89 |
| 2011/0063558 | A1* | 3/2011 | Ishihara et al. | 349/141 |
| 2011/0141424 | A1 | 6/2011 | Lee et al. | |
| 2011/0242442 | A1 | 10/2011 | Lee et al. | |
| 2012/0038843 | A1* | 2/2012 | Jung et al. | 349/41 |

FOREIGN PATENT DOCUMENTS

| | | | |
|---|---|---|---|
| CN | 101604101 | A | 12/2009 |
| CN | 101957527 | A * | 1/2011 |
| CN | 102096258 | A | 6/2011 |
| CN | 102292666 | A | 12/2011 |
| CN | 102629041 | A | 8/2012 |
| CN | 102629607 | A | 8/2012 |
| CN | 202443185 | U | 9/2012 |
| KR | 1020090130826 | A | 12/2009 |

OTHER PUBLICATIONS

International Search Report (Chinese language) issued by the International Searching Authority, rendered Sep. 9, 2012, 15 pages.
The State Intellectual Property Office of the People's Republic of China ("SIPO") (Chinese Language) Office Action issued on Mar. 5, 2013 by SIPO in Chinese Patent Application No. 201210063694.4; six (6) pages.
English Translation of The State Intellectual Property Office of the People's Republic of China ("SIPO") Office Action issued on Mar. 5, 2013 by SIPO in Chinese Patent Application No. 201210063694.4; four (4) pages.
The State Intellectual Property Office of the People's Republic of China ("SIPO") (Chinese Language) Office Action issued on Jun. 3, 2013 by SIPO in Chinese Patent Application No. 201210063694.4; six (6) pages.
English Translation of The State Intellectual Property Office of the People's Republic of China ("SIPO") Office Action issued on Jun. 3, 2013 by SIPO in Chinese Patent Application No. 201210063694.4; five (5) pages.
The State Intellectual Property Office of the People's Republic of China ("SIPO") (Chinese Language) Office Action issued on Oct. 28, 2013 by SIPO in Chinese Patent Application No. 201210063694.4; six (6) pages.
English Translation of The State Intellectual Property Office of the People's Republic of China ("SIPO") (Chinese Language) Office Action issued on Oct. 28, 2013 by SIPO in Chinese Patent Application No. 201210063694.4; four (4) pages.
Restriction Requirement issued by United States Patent and Trademark Office dated Oct. 10, 2014, 9 pages.

Office Action issued by the United States Patent and Trademark Office dated Jan. 2, 2015, 18 pages.
Office Action issued by the United Patent and Trademark Office dated Apr. 24, 2015, 14 pages.
The State Intellectual Property Office of the People's Republic of China ("SIPO") (Chinese Language) First Office Action issued on Mar. 22, 2013 by SIPO in Chinese Patent Application No. 201210028990.0; nine (9) pages.
English Translation of The State Intellectual Property Office of the People's Republic of China ("SIPO") First Office Action issued on Mar. 22, 2013 by SIPO in Chinese Patent Application No. 201210028990.0; twelve (12) pages.
English abstract of CN1721961(A) listed above, 1 page.
The State Intellectual Property Office of the People'S Republic of China ("SIPO") (Chinese Language) Second Office Action issued on May 21, 2013 by SIPO in Chinese Patent Application No. 201210028990.0; ten (10) pages.
English Translation of The State Intellectual Property Office of the People's Republic of China ("SIPO") Second Office Action issued on May 21, 2013 by SIPO in Chinese Patent Application No. 201210028990.0; fifteen (15) pages.
English abstract of CN101604101(A) listed above, 2 pages.
The State Intellectual Property Office of the People's Republic of China ("SIPO") (Chinese Language) Third Office Action issued on Jul. 19, 2013 by SIPO in Chinese Patent Application No. 201210028990.0; five (5) pages.
English Translation of The State Intellectual Property Office of the People'S Republic of China ("SIPO") Third Office Action issued on Jul. 19, 2013 by SIPO in Chinese Patent Application No. 201210028990.0; three (3) pages.
English abstract of CN102096258(A) listed above, 2 pages.
The State Intellectual Property Office of the People's Republic of China ("SIPO") (Chinese Language) Fourth Office Action issued on Nov. 29, 2013 by SIPO in Chinese Patent Application No. 201210028990.0; three (3) pages.
English Translation of The State Intellectual Property Office of the People's Republic of China ("SIPO") Fourth Office Action issued on Nov. 29, 2013 by SIPO in Chinese Patent Application No. 201210028990.0; one (1) page.
Notification of Transmittal of Copies of Translation of the International Preliminary Report on Patentability issued by the International Bureau of WIPO on Aug. 12, 2014 for International Application No. PCT/CN2012/085982, 1 page.
International Preliminary Report on Patentability issued by the International Bureau of Wipo on Aug. 21, 2014 for International Application No. PCT/CN2012/085982, 11 pages.
International Search Report (Chinese language) on Patentability issued by the State Intellectual Property Office on Feb. 9, 2012 for International Application No. PCT/CN2012/085982, 5 pages.
English abstract of CN102629041(A) listed above, 1 page.
English abstract of CN202443185(U) listed above, 1 page.
Office Action (Korean language) issued by the Korean Patent Office for Korean, Patent Application No. 9-5-2014-008734485 dated Apr. 4, 2014, 6 pages.
English Translation of Office Action issued by the Korean Patent Office for Korean Patent Application No. 9-5-014-008734485 dated Apr. 4, 2014, 5 pages.
English abstract of KR20090130826(A) listed above, 1 page.
Rejection Decision (Chinese language) issued by the State Intellectual Property Office ("SIPO") on Nov. 4, 2014 for application No. 201210063694.2, 6 pages.
English translation of Rejection Decision issued by SIPO for application No. 201210063694.2 (listsed above), 7 pages.
Extended European Search Report issued by European Patent Office, in European patent application no. 12832731.9, dated Oct. 16, 2015; 8 pages.
Office Action issued by United States Patent and Trademark Office, in U.S. Appl No. 13/824,739, dated Aug. 26, 2015; 17 pages.

* cited by examiner

ARRAY SUBSTRATE, AND DUAL VIEW FIELD DISPLAY DEVICE AND MANUFACTURING METHOD THEREOF

CROSS REFERENCE TO RELATED APPLICATIONS

This application is based on International Application No. PCT/CN2012/087238 filed on Dec. 23, 2012, which claims priority to Chinese National Application No. 101210029090.8 filed on Feb. 9, 2012 and Chinese National Application No. 201210063694.4 filed on Mar. 12, 2012 the contents of which are incorporated herein by reference.

TECHNICAL FIELD

Embodiments of the present invention relate to an array substrate, and a dual view field display device and a manufacturing method thereof.

BACKGROUND

Figure 1:
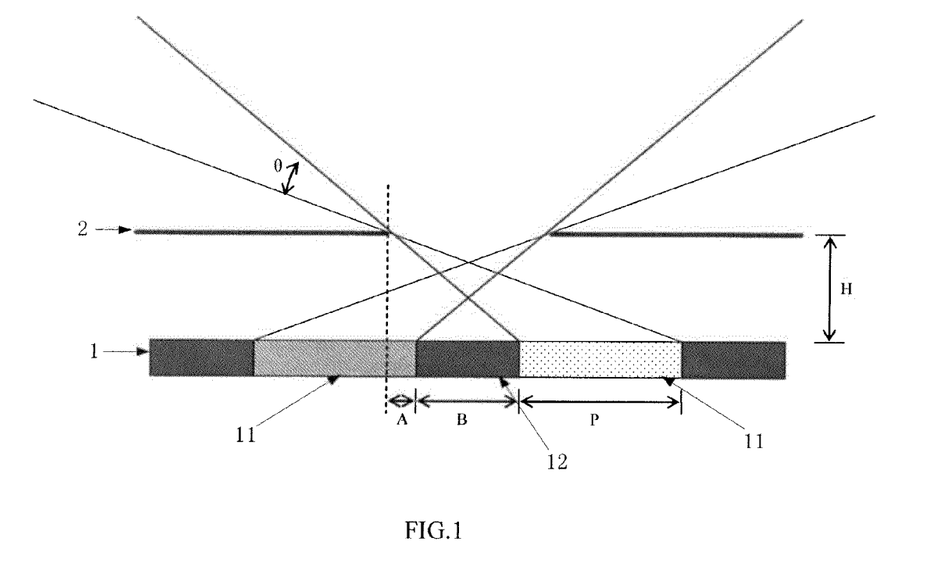
FIG. 1 is a structurally schematic view showing an existing dual view field liquid crystal display device.

A dual view field display technology refers to a technology by which different contents can be watched in two view fields on two sides of a display screen. A dual view field device usually comprises one display screen and one barrier, as shown in FIG. 1. A display screen 1 comprises a plurality of pixel units, each of the pixel units includes a sub-pixel electrode 11 for display of one certain view field and a control circuit (such as a TFT circuit) covered by a black matrix 12, and such a pixel structure is generally called as "sub-pixel structure". The width of the sub-pixel electrode 11 is P, the width of the black matrix 12 between two adjacent sub-pixel electrodes is B, the distance between a barrier 2 and the display screen 1 is H, and the distance from the projection of an edge of an opening of the barrier 2 at the location of the sub-pixel electrode 11 on the display screen 1 to an edge of the black matrix 12 is A. The centerline of the opening of the barrier coincides with the centerline between two adjacent sub-pixel electrodes, so the width of the opening of the barrier is B+2A. An angle θ is the angle of a single view field, and only within this range, a viewer can see light emitted by a sub-pixel as a point. The visible range of the single view field can be enlarged by increasing the angle θ, and in turn, the display quality of the dual view field display device can be improved. Among the angle θ and P, H, A, and B, there is a relationship as represented by the following formula 1:

$$\tan\theta = \frac{HP}{H^2 + (B+A)(B+A+P)} \quad \text{formula 1}$$

Figure 2:
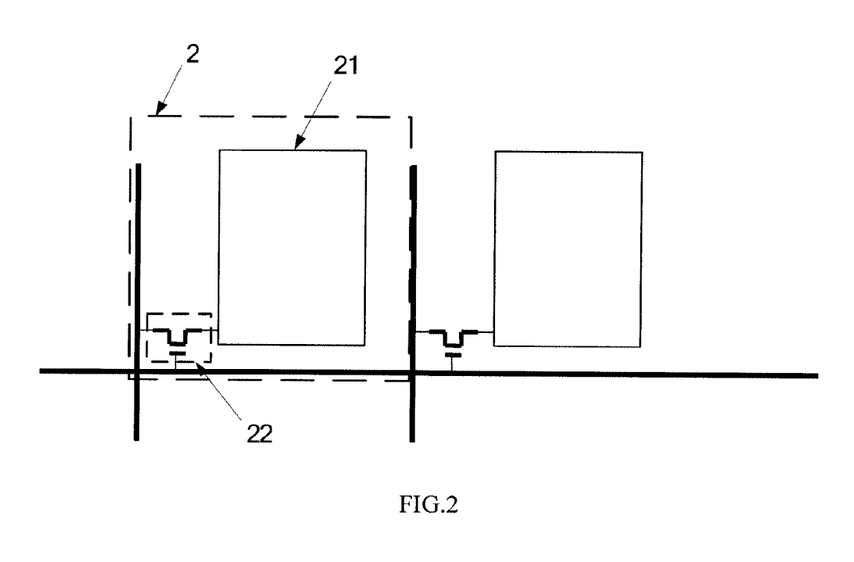
FIG. 2 is a structurally schematic view showing a TFT array substrate of an existing dual view field liquid crystal display device.

As can be seen from the formula 1, when the distance A from the projection of the edge of the opening of the barrier at the location of the sub-pixel electrode on the display screen to the edge of the black matrix 12 and the width B of the black matrix between two adjacent sub-pixel electrodes are constant, in order to increase the angle θ, it is necessary to decrease the distance H between the barrier and a light point of the color filter substrate is accordingly, or to properly to reduce the width P of the sub-pixel electrode. As to the prior art, when a Thin Film Transistor Liquid Crystal Display (TFT-LCD) is adopted as the display device, decreasing of the distance H between the barrier and the light point of the color filter substrate means reduction in thickness for a color filter glass. However, it is very difficult to produce an ultrathin color filter glass, and moreover, as the thickness of the color filter glass is decreased, the sturdiness of the color filter glass substrate will also be degraded greatly, which will severely affect the quality of the liquid crystal display device. The structure of a TFT array substrate of an existing dual view field liquid crystal display device is shown in FIG. 2, in which one pixel unit 2 includes a sub-pixel electrode 21 and a TFT circuit 22. In the pixel unit 2, the width P of the sub-pixel electrode 21 is usually 50 μm. When the width P of the sub-pixel electrode 21 is reduced to a very small value (such as 3 μm), it is difficult to decrease the TFT circuit 22 in the same proportion as the width P of the sub-pixel electrode is reduced. The proportion of the black matrix shielding the TFT circuit to the sub-pixel region will be increased accordingly, so that the aperture ratio is reduced significantly and the quality of the liquid crystal display device is affected. When an Organic Light Emitting Diode (OLED) is adopted as the display device, decreasing of the distance H between the barrier and the light point also demands reduction in thickness of a glass substrate.

As can be seen, as to the prior art, in order to enlarge the visible range of each single-side view field for a dual view field display device, it is necessary that the thickness of a glass substrate be decreased, and this leads to rising of production costs and a significant degradation of yield and reliability of substrates.

SUMMARY

Embodiments of the invention provide an array substrate and a dual view field display device and a manufacturing method thereof to solve the problem that, for the purpose of enlarging the visible range of a single-side view field, the glass substrate has to be thinned, and therefore rising of the production costs and significant degradation of yield and reliability of substrates are caused.

An aspect of the invention provides an array substrate, comprising a plurality of pixel units defined by gate lines and data lines which intersect each other, each of the pixel units including a pixel electrode and a TFT circuit; the pixel electrode of each of the pixel units comprises at least two first pixel electrodes and at least two second pixel electrodes, which are spaced from each other; the TFT circuit of each of the pixel units comprises a first sub-TFT circuit connected to the first pixel electrodes and a second sub-TFT circuit connected to the second pixel electrodes.

For example, in each of the pixel units, the first pixel electrodes form a first comb-like structure as a whole, the second pixel electrodes form a second comb-like structure as a whole, and branch portions of the first comb-like structure and branch portions of the second comb-like structure are disposed to be interlaced with each other.

Another aspect of the invention provides a dual view display device, comprising: a display panel and a dual view barrier provided over the display panel; the display panel includes the array substrate described as above.

For example, the display panel may be a liquid crystal panel.

For example, the liquid crystal panel may include an array substrate, a color filter substrate and liquid crystals filled between the array substrate and the color filter substrate; the color filter substrate comprises a transparent substrate and a color filter disposed thereon; and the array substrate is the above array substrate.

Further, the display panel may be an OLED panel; the OLED panel comprises an array substrate and a packaging layer, array substrate; the array substrate comprises a plurality of pixel units defined by gate lines and data lines which intersect each other, each of the pixel units includes an electroluminescence (EL) layer and a control circuit, the EL layer includes a metal cathode, a pixel electrode and an organic light emitting material located between the metal cathode and the pixel electrode; the pixel electrode of each of the pixel units comprises at least two first pixel electrodes and at least two second pixel electrodes, which are spaced from each other; the control circuit of each of the pixel units comprises a first sub-control circuit connected to the first pixel electrodes and a second sub-control circuit connected to the second pixel electrodes.

Further another aspect of the invention provides a manufacturing method of a dual view field liquid crystal display device, comprising: forming TFT circuits and pixel electrodes on a lower substrate through patterning processes, wherein the pixel electrode of each of pixel units comprises at least two first pixel electrodes and at least two second pixel electrodes, which are spaced from each other; and the TFT circuit of each of the pixel units comprises a first sub-TFT circuit connected to the first pixel electrodes and a second sub-TFT circuit connected to the second pixel electrodes.

For example, in the above method, on an upper substrate, a dual view barrier and a color filter are formed through patterning processes.

For example, in the above method, the upper substrate and the lower substrate are assembled together to form a cell, and liquid crystals are filled in the cell.

Still further another aspect of the invention provides a manufacturing method of a dual view field OLED display device, comprising: forming control circuits on a lower substrate through patterning processes; and forming an EL layer on the lower substrate with the control circuits formed thereon, wherein the EL layer includes a metal cathode, a pixel electrode and an organic light emitting material located between the metal cathode and the pixel electrode; the pixel electrode of each of pixel units comprises at least two first pixel electrodes and at least two second pixel electrodes, which are spaced from each other; the control circuit of each of the pixel units comprises a first sub-control circuit connected to the first pixel electrodes and a second sub-control circuit connected to the second pixel electrodes.

For example, in the above method, on an upper substrate, a dual view barrier is obtained through patterning processes.

For example, in the above method, the upper substrate is made to cover the lower substrate.

In the array substrates provided by embodiments of the invention, the first pixel electrodes and the second pixel electrodes within each pixel unit can be driven separately, and after a display panel (such as a liquid crystal panel or an OLED panel) has been formed, display in corresponding regions can be controlled separately. Then, the dual view barrier can be produced within the display panel, and addition of a new process or use of a new production equipment can be avoided, thereby reducing the production cost of the dual view display device.

The dual view field liquid crystal display device and the manufacturing method thereof provided by embodiments of the invention, by means of changing a sub-pixel electrode for display of one certain view field within one pixel unit in prior art into a plurality of first-view-field pixel electrodes and second-view-field pixel electrodes which are spaced from each other, significantly decreases the width of a single view field pixel electrode so as to enlarge the visible range of each single-side view field. In such a way, without thinning the thickness of a glass substrate, enlargement of the visible range of each single-side view field is realized, production costs are reduced, and yield and reliability of substrates are enhanced.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as commonly understood by one of ordinary skill in the art to which this invention belongs. Terms "first", "second" and the like used in specification and claims of the patent application of the invention do not show any order, number or importance, but are only used to distinguish different constituent parts. Likewise, a term "a," "an," "the" or the like does not indicate limitation in number, but specifies the presence of at least one. Terms such as "connection," "connected," or the like is not limited to physical or mechanical connection, but can include electrical connection, whether directly or indirectly. "Upper," "lower," "left," "right" or the like is only used to describe a relative positional relationship, and when an absolute position of the described object is changed, the relative positional relationship is also changed accordingly.

Embodiment 1

Figure 4A:
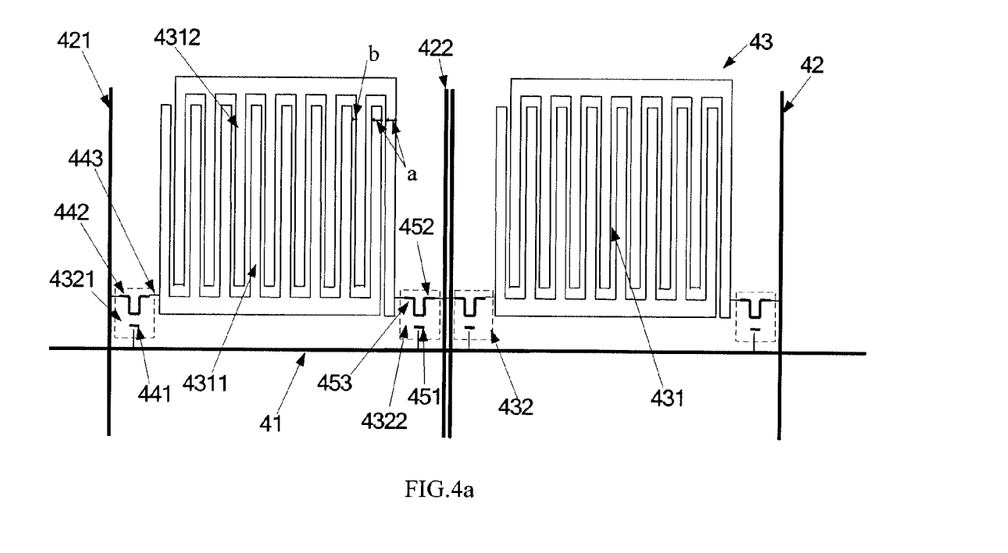
FIG. 4a is a structurally schematic view showing an array substrate provided by an embodiment of the invention.

An embodiment of the invention provides an array substrate. As shown in FIG. 4a, the array substrate comprises a plurality of pixel units 43 defined by gate lines 41 and data lines 42 which intersect each other, and each of the pixel units 43 includes a pixel electrode 431 and a thin film transistor (TFT) circuit 432.

The pixel electrode 431 of each of the pixel units 43 comprises at least two first pixel electrodes 4311 and at least two second pixel electrodes 4312 which are spaced from each other.

The TFT circuit 432 of each of the pixel units 43 comprises a first sub-TFT circuit 4321 connected to the first pixel electrodes 4311 and a second sub-TFT circuit 4322 connected to the second pixel electrodes 4312. That is, all of the first pixel electrodes 4311 are connected to corresponding first sub-TFT circuits 4321, and all of the second pixel electrodes 4312 are connected to corresponding second sub-TFT circuits 4322. Each first pixel electrode 4311 can be connected to the first sub-TFT circuit 4321 through any structure capable of achieving circuit conduction, and each second pixel electrode 4312 can be connected to the second sub-TFT circuit 4322 through any structure capable of achieving circuit conduction.

In the embodiment, each of the pixel units 43 may approximate an existing ordinary pixel unit at a size scale. Because at least two first pixel electrodes 4311 and at least two second pixel electrodes 4312 are included in each of the pixel units 43, in the case where sizes of pixel units approximate each other, a pixel electrode in the embodiment is much smaller than a common pixel electrode in a pixel unit in an existing array substrate. Thus, the pixel structure on the array substrate according to the embodiment of the invention may be called as "micro-pixel" structure.

Preferably, in each of the pixel units, all of the first pixel electrodes 4311 form a first comb-like structure as a whole, all of the second pixel electrodes 4312 form a second comb-like structure as a whole, and the branch portions (electrodes) of the first comb-like structure and the branch portions (electrodes) of the second comb-like structure are disposed to be interlaced with each other. FIG. 4a shows this structure. Because the first comb-like structure and the second comb-like structure have a relatively regular configuration, this structure can be easily manufactured, a better yield of product can be achieved, and there is a regular electric field which is comparatively easy to be controlled.

Preferably, in the array substrate according to the embodiment, widths of the first pixel electrodes 4311 and the second pixel electrodes 4312 may be in the range of 1-20 μm. With this width parameter, a better control on electric field can be achieved while manufacturing yield of the process can be guaranteed.

Further, in the embodiment of the invention, as shown in FIG. 4a, the gate electrode of the first sub-TFT circuit 4321 and the gate electrode of the second sub-TFT circuit 4322 are connected to a same gate line 41 which extend transversely; the source electrode of the first sub-TFT circuit 4321 and the source electrode of the second sub-TFT circuit 4322 are connected to data lines 42 (422, 421) on two sides of one pixel unit, respectively; and the drain electrode of the first sub-TFT circuit 4321 is connected to the first pixel electrodes 4311, and the drain electrode of the second sub-TFT circuit 4322 is connected to the second pixel electrodes 4312.

When the array substrate provided by the embodiment of the invention is used for manufacture of a dual view field display device, owing to the specific structure ("micro-pixel" structure) of the pixel units on the array substrate, a dual view barrier can be fabricated within a display panel, and addition of a new process or use of a new production equipment can be avoided. Thereby, the production cost of the dual view field display device is reduced, and yield and reliability of substrates are enhanced.

In terms of basic principle, the principle of a dual view display and the principle of a 3D display are the same, and the both focus on discrimination between different kinds of view field display information. The only difference lies in that, what to be discriminated by the 3D display are view field signals for a left eye and a right eye (which are to be received by different eyes of the same viewer), and what to be discriminated by the dual view display are a first view field signal and a second view field signal (which are to be received by different viewers). Therefore, those skilled in the art can understand that, the array substrate according to the embodiment may also be used to implement the 3D display. Upon implementation of the 3D display, within each pixel unit, the first pixel electrodes correspond to a left-eye signal, and the second pixel electrodes correspond to a right-eye signal; or the first pixel electrodes correspond to the right-eye signal, and the second pixel electrodes correspond to the left-eye signal. Upon implementation of the dual view display, within each pixel unit, the first pixel electrodes correspond to a first view field signal, and the second pixel electrodes correspond to a second view field signal; or the first pixel electrodes correspond to the second view field signal, and the second pixel electrodes correspond to the first view field signal.

In the embodiment of the invention, the array substrate may be a flexible array substrate for manufacture of a flexible display device, and may also be an ordinary array substrate which uses a glass substrate, a plastic substrate, or the like. Moreover, the array substrate may be an array substrate of a TN mode, an ADS mode or other mode. When the array substrate is of an ADS mode array substrate, in each pixel unit, there is further included a common electrode (not shown) located between a base substrate of the array substrate and the pixel electrodes; further, the common electrode may have a comb shape or have a plate shape.

In the array substrate provided by the embodiment of the invention, the first pixel electrodes and the second pixel electrodes are included within each pixel unit, and the first pixel electrodes and the second pixel electrodes can be driven separately by means of inputting display signals, respectively, and therefore, it is possible that after a display panel (e.g., a liquid crystal panel, an OLED panel, or a display panel of other type) is produced, image display in corresponding regions can be controlled separately. Furthermore, same display signals or different display signals can be inputted to the first pixel electrodes and the second pixel electrodes according to practical requirements; or, the first pixel electrodes and the second pixel electrodes may operate at the same time or not. As can be understood by those skilled in the art, according to practical requirements, the array substrate in the embodiment may be specifically applied to display devices of different types, such as, 3D display, touch display, flexible display, etc; furthermore, the array substrate in the embodiment may be an ordinary array substrate, and may also be an oxide semiconductor array substrate or an organic semiconductor array substrate, and the invention is not limited thereto.

Embodiment 2

The present embodiment and the next embodiment 3 described later each provide a dual view field display device, which uses the array substrate described in the above Embodiment 1, such as a dual view field liquid crystal display device and a dual view field OLED display device. A first view field pixel electrode mentioned in each of the following embodiments corresponds to the first pixel electrode in the array substrate described in Embodiment 1; and a second view field pixel electrode corresponds to the second pixel electrode in the array substrate described in Embodiment 1.

Figure 3:
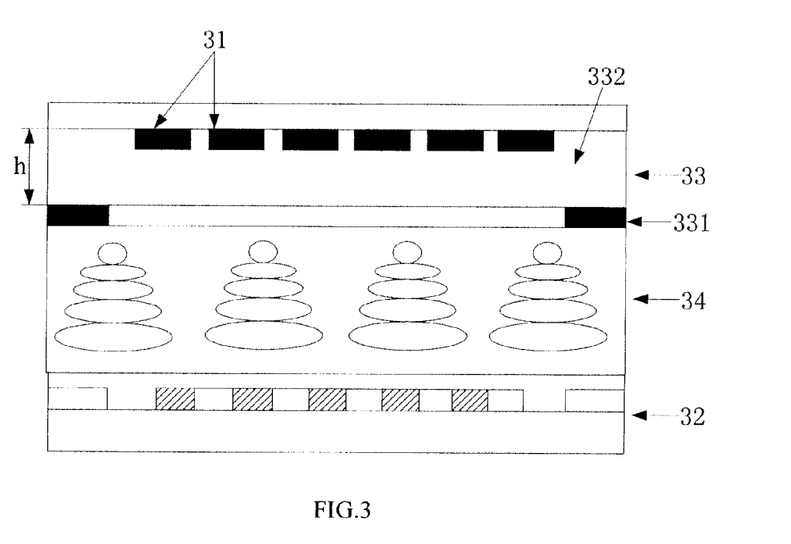
FIG. 3 is a structurally schematic view showing a dual view field liquid crystal display device provided by an embodiment of the invention.

The embodiment of the invention provides a dual view field liquid crystal display device, which uses the array substrate described in the above Embodiment 1, as shown in FIG. 3.

The display device comprises a dual view barrier 31, and a TFT array substrate 32 and a color filter substrate 33 which are assembled together to form a cell, and liquid crystals 34 being filled between the TFT array substrate 32 and the color filter substrate 33. As shown in FIG. 4a, the TFT array substrate 32 comprises a plurality of pixel units 43 defined by gate lines 41 and data lines 42 which intersect each other, and each of the pixel units 43 includes a pixel electrode 431 and a TFT circuit 432.

The pixel electrode 431 of each of the pixel units 43 comprises at least two first view field pixel electrodes 4311 and at least two second view field pixel electrodes 4312 which are spaced from each other.

The TFT circuit 432 of each of the pixel units 43 comprises a first sub-TFT circuit 4321 connected to the first view field pixel electrodes 4311 and a second sub-TFT circuit 4322 connected to the second view field pixel electrodes 4312. That is, in these pixel units, all of the first view field pixel electrodes 4311 are connected to corresponding first sub-TFT circuits 4321, and all of the second view field pixel electrodes 4312 are connected to corresponding second sub-TFT circuits 4322. Each first view field pixel electrode 4311 can be connected to the first sub-TFT circuit 4321 through any structure capable of achieving circuit conduction, and each second view field pixel electrode 4312 can be connected to the second sub-TFT circuit 4322 through any structure capable of achieving circuit conduction.

The dual view field liquid crystal display device provided by the embodiment of the invention, by means of changing a sub-pixel electrode of a sub-pixel for display of a certain view field within one pixel unit in prior art into a plurality of first-view-field pixel electrodes and second-view-field pixel electrodes which are spaced from each other, significantly decreases the width of one single view field pixel electrode so as to enlarge the visible range of each single-side view field. In such a way, without thinning the thickness of a glass substrate, enlargement of the visible range of each single-side view field can be realized, production costs are reduced, and yield and reliability of substrates are enhanced.

It is to be noted that, the at least two first view field pixel electrodes 4311 and the at least two second view field pixel electrodes 4312 which are spaced from each other are both slim, strip-like electrodes. The at least two first view field pixel electrodes 4311 and the at least two second view field pixel electrodes 4312 which are spaced from each other may be parallel to the gate lines 41, or may be parallel to the data lines 42. Exemplarily, in the dual view field liquid crystal display device provided by the embodiment of the invention, description will be given to an example in which the at least two first view field pixel electrodes 4311 and the at least two second view field pixel electrodes 4312 which are spaced from each other are parallel to the data lines 42.

Further, as shown in FIG. 4a, in the dual view field liquid crystal display device provided by the embodiment of the invention, in each of the pixel units 43, all of the first view field pixel electrodes 4311 form a first comb-like structure as a whole, all of the second view field pixel electrodes 4312 form a second comb-like structure as a whole, and the branch portions of the first comb-like structure and the branch portions of the second comb-like structure are disposed to be interlaced with each other. That is, all of the first view field pixel electrodes 4311 and all of the second view field pixel electrodes 4312 may exhibit comb-like structures which are spaced from each other as a whole. Preferably, the first view field pixel electrodes 4311 and the second view field pixel electrodes 4312 have the same width; in the embodiment, width of each of them is "a," and "a" may be in the range of 1-20 μm. Certainly, the first view field pixel electrodes 4311 and the second view field pixel electrodes 4312 may have different widths. Preferably, in each of the pixel units 43, the numbers of the first view field pixel electrodes 4311 and the number of the second view field pixel electrodes 4312 are equal, and in this case, a better display effect can be achieved. In the embodiment shown in FIG. 4a, in each of the pixel units 43, the number of each of the first view field pixel electrodes 4311 and the number of the second view field pixel electrodes 4312 are each 8; namely, each comb-like electrode has eight branches. Obviously, the present invention is not limited thereto.

Figure 5:
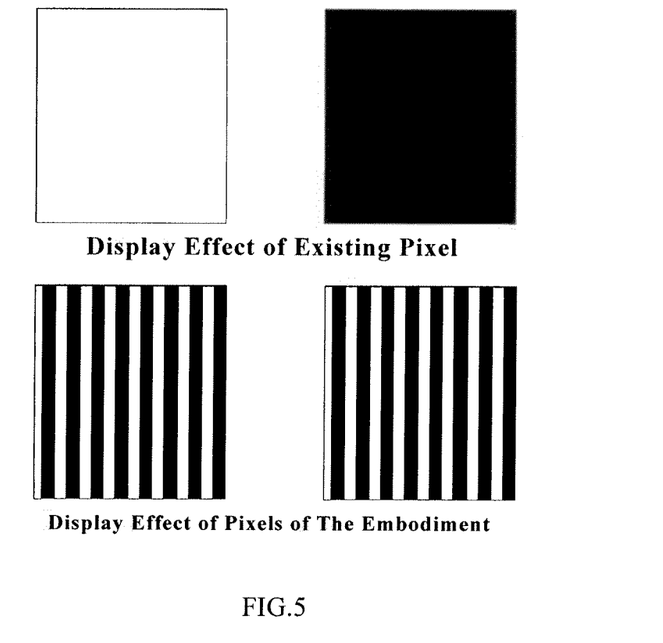
FIG. 5 shows views comparing pixel display results of an existing liquid crystal display device and a dual view field liquid crystal display device provided by an embodiment of the invention.

In the embodiment, original bulk-like single view field sub-pixel electrodes in two adjacent pixel units now are changed into the first view field pixel electrodes and the second view field pixel electrodes in a same pixel unit which are each in a comb shape and interdigitated. When pixels show in different colors in two view fields, if the influence of the tiny electric field present between pixel electrodes for the two view fields on liquid crystals is neglected, comparison of the pixel display results between the dual view field liquid crystal display device provided by the embodiment of the invention and an existing liquid crystal display device is shown in FIG. 5. As can be clearly noted, in comparison with prior art, the width of a single view field pixel electrode is significant decreased in the liquid crystal display device provided by the embodiment of the invention. Because the width of the single-side view field pixel electrode in such a pixel structure is far smaller than that of a sub-pixel electrode structure in prior art, such a pixel structure can be named as "micro-pixel structure".

Further, as shown in FIG. 4a, the gate electrode 441 of the first sub-TFT circuit 4321 and the gate electrode 451 of the second sub-TFT circuit 4322 are connected to a same gate line 41; the source electrode 442 of the first sub-TFT circuit 4321 and the source electrode 452 of the second sub-TFT circuit 4322 are connected to data lines 421 and 422 on two sides of one pixel unit, respectively; and the drain electrode 443 of the first sub-TFT circuit 4321 is connected to the first view field pixel electrodes 4311, and the drain electrode 453 of the second sub-TFT circuit 4322 is connected to the second view field pixel electrodes 4312.

In such a way, pixel electrodes for the same view field share a same data line, a same gate line and a same TFT, so that reduction in the aperture ratio of pixels is limited. Thus, the problem that aperture ratio of the liquid crystal display device is greatly degraded can be avoided.

Still further, as shown in FIG. 3, in the dual view field liquid crystal display device, the dual view barrier 31 may be located above or below a color filter 331 of the color filter substrate 33, and the distance from the dual view barrier 31 to the color filter 331 may be in the range of 1-100 µm. The dual view barrier 31 includes a plurality of black stripes parallel to each other, and portions between the black stripes are transparent so as to allow light to pass through for display.

When the dual view barrier 31 is located above the color filter 331, a transparent layer 332 with a thickness in the range of 1-100 µm may be further provided between the dual view barrier 31 and the color filter 331.

Figure 4B:
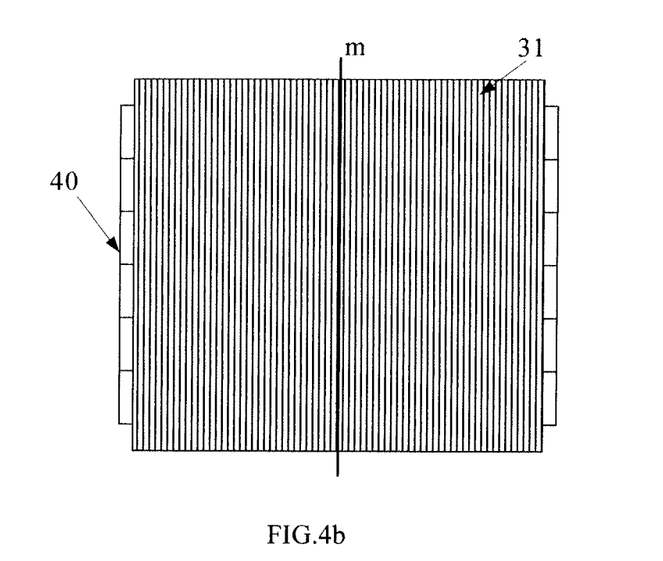
FIG. 4b is a structurally schematic view showing a TFT array substrate of another dual view field liquid crystal display device provided by an embodiment of the invention.

Further, as shown in FIG. 4b, the centerline of the dual view barrier 31 and the centerline of a display region 40 of the display device coincide at a straight line "m."

The transparent layer 332 may be a transparent thin film formed of any kind of suitable transparent material pervious to light, and for example, a plastic thin film or an organic silicon rubber may be used to form the transparent layer. The transparent layer 332 mainly acts to space the dual view barrier 332 from the color filter 321 by a certain height, and the thickness of the transparent layer 332 is a distance H between the barrier and the display screen. In the embodiment of the invention, for example, the distance H between the barrier and a light point of the color filter may be 5 µm, the width "a" of a first view field pixel electrode 4311 and a second view field pixel electrode 4312 may be 3 µm, the width "b" of each slit between the first view field pixel electrode 4311 and the second view field pixel electrode 4312 may be 2 µm; when the distance A from the projection of an edge of an opening of the barrier at the location of a sub-pixel electrode on the display screen to an edge of a black matrix is zero, the visible angle of a single view field can be 45° from calculation. As such, without reducing of the thickness of a color filter glass substrate, enlargement of the visible range of a single view field is realized, and the sturdiness of the color filter glass substrate is guaranteed. On the other hand, pixel electrodes for a same view field share a same data line, a same gate line and a same TFT, so that reduction in the aperture ratio of pixels is limited. Thus, the problem that aperture ratio of the liquid crystal display device is greatly degraded can be avoided.

Figure 6:
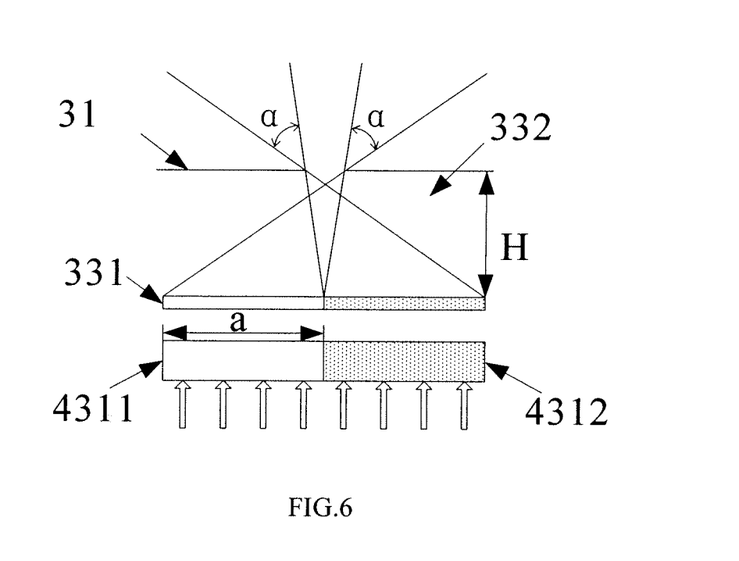
FIG. 6 is a view illustrating the display principle of a dual view field liquid crystal display device provided by an embodiment of the invention.

The display principle of the dual view field liquid crystal display device provided by the embodiment of the invention is shown in FIG. 6. FIG. 6 is merely a schematic view. As described above, a first view field pixel electrode 4311 and a second view field pixel electrode 4312 are separate from each other; however, the interval between them is not shown in the figure but is taken into width of an electrode for consideration. A gap between stripes on the parallax barrier 31 corresponds to the portion of the first view field pixel electrode 4311 and the portion of the second view field pixel electrode 4312 which are adjacent to each other (branch portions of the two comb-like electrodes which are interlaced with each other).

For example, the width "a" of the first view field pixel electrode 4311 and the second view field pixel electrode 4312 may be 3 µm, and the thickness H of the transparent layer 332 between the dual view barrier 31 and the color filter 331 may be 5 µm. The exiting direction of light rays is denoted by an arrow in the figure, and as can be seen, the visible angle of each of left and right view fields is α.

Figure 7:
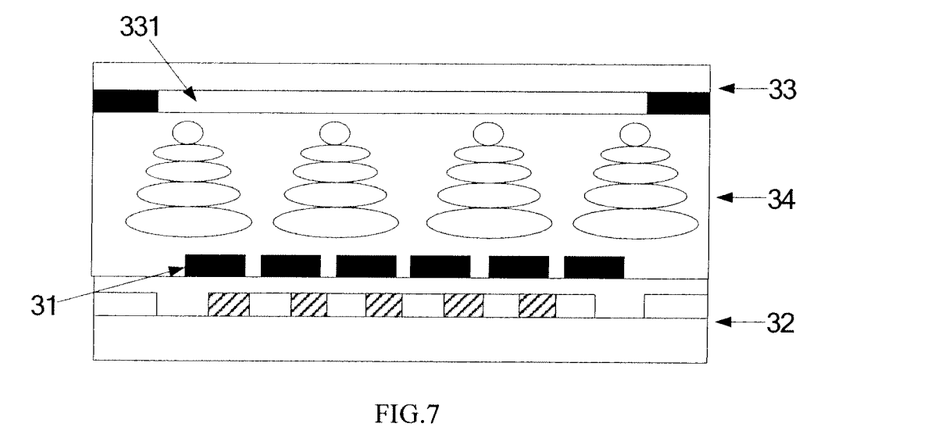
FIG. 7 is a structurally schematic view showing another dual view field liquid crystal display device provided an embodiment of the invention.

The embodiment of the invention provides another dual view field liquid crystal display device, as shown in FIG. 7.

Regarding the another dual view field liquid crystal display device provided by the present embodiment, the structure of its TFT array substrate is similar to the structure in the embodiment as shown in FIG. 3, the only difference is that the dual view barrier 31 may be further located below the color filter 331. When the dual view barrier 31 is located below the color filter 331, the dual view barrier 31 may be located directly on the top surface of the TFT array substrate 32.

Because the distance from a light point of the top surface of a TFT array substrate to a dual view barrier usually includes the thickness of a color filter, the thickness of an array and the thickness of a liquid crystal alignment film, the sum of these thicknesses is usually in the range of 4-7 µm. As such, the transparent layer is not used as a spacer, and in this case such a condition that the distance H between a barrier and a light point of the color filter can be in the range of 1-100 µm can also be met, so that the procedure can be simplified and costs can be saved.

Figure 8:
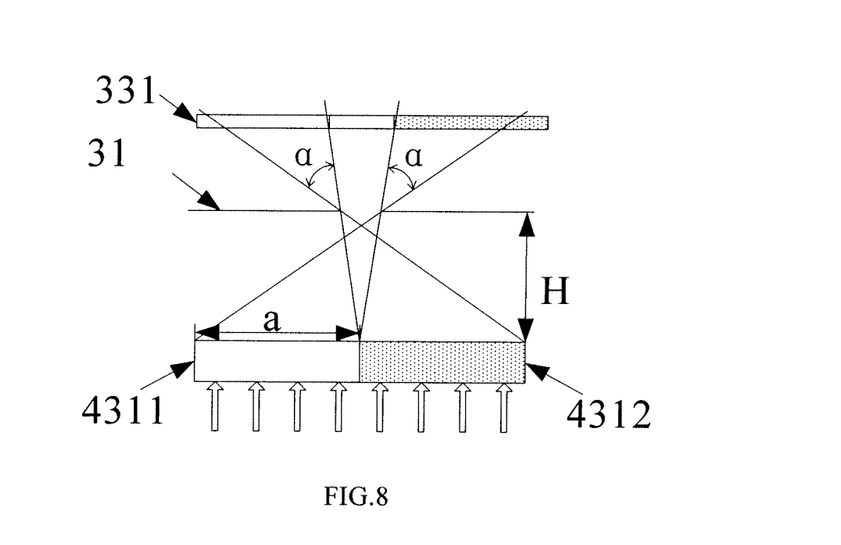
FIG. 8 is a view illustrating the display principle of another dual view field liquid crystal display device provided an embodiment of the invention.

The display principle of the above dual view field liquid crystal display device is shown in FIG. 8. FIG. 8 is merely a schematic view. As described above, the first view field pixel electrode 4311 and the second view field pixel electrode 4312 are separate from each other, yet, an interval between them is not shown in the figure, but is taken into the width of an electrode for consideration. The gap between stripes on the parallax barrier 31 corresponds to the portion of the first view field pixel electrode 4311 and the portion of the second view field pixel electrode 4312 which are adjacent to each other (branch portions of the two comb-like electrodes which are interlaced with each other).

For example, the width "a" of the first view field pixel electrode 4311 and the second view field pixel electrode 4312 may be 3 µm, and the distance H between the dual view barrier 31 and the pixel electrode may be 5 µm, and here a color filter 331 located above the dual view barrier 31. An exiting direction of light rays is denoted by an arrow in the figure, and as can be seen, the visible angle of each of left and right view fields is also α.

In the embodiments illustrated in FIG. 3 and FIG. 7, the color filter substrate is an example of a counter substrate disposed opposite to the array substrate. When a color filter is formed on the array substrate, it is also possible that the liquid crystal display device does not include a separate color filter substrate.

It is to be noted that, in the dual view field liquid crystal display device shown in FIG. 3 or FIG. 7, the centerline of the dual view barrier coincides with the centerline of the display region of the display device. That is, the slit centerline at the center of the dual view barrier coincides with the slit between a first view field pixel electrode and a second view field pixel electrode at the center of the display screen. In addition, the number of the slits of the dual view barrier is the half of the sum of numbers of the first view field pixel electrodes and the numbers of the second view field pixel electrodes.

Embodiment 3

Figure 9A:
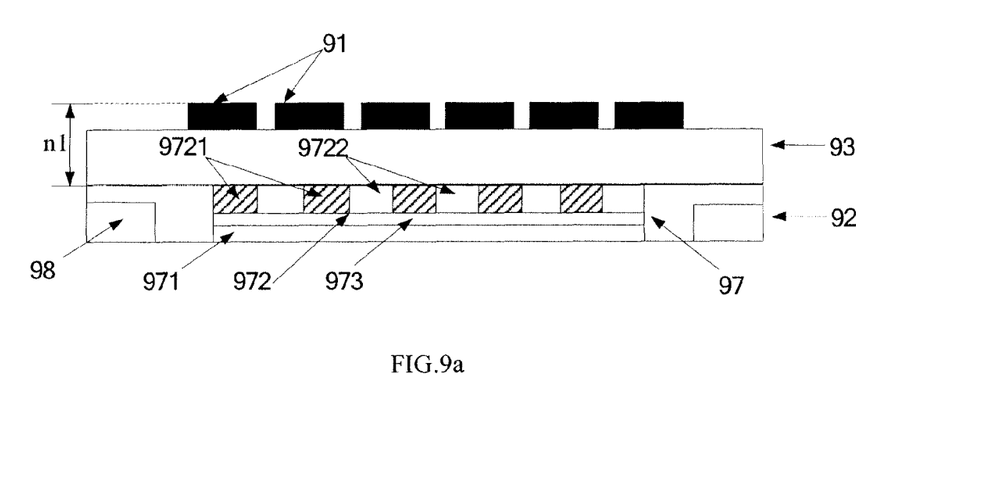
FIG. 9a is structurally schematic view showing a dual view field OLED display device provided by an embodiment of the invention.
Figure 9B:
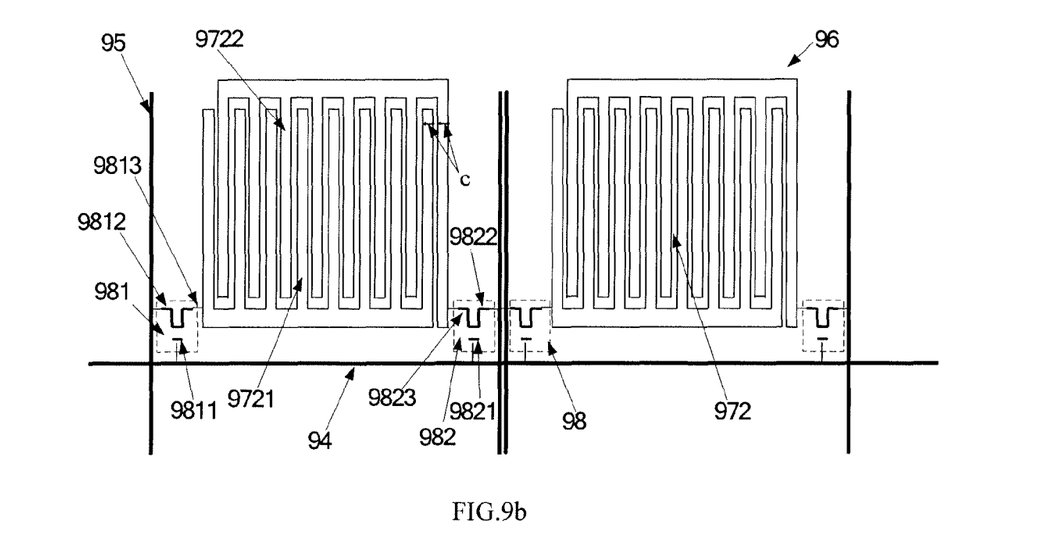
FIG. 9b is a structurally schematic view showing a TFT array substrate of a dual view field OLED display device provided by an embodiment of the invention.

The present embodiment provides a dual view field OLED display device, which uses the pixel unit structure of the array substrate described as Embodiment 1. As shown in FIG. 9a, the pixel unit structure comprises: a dual view barrier 91, a TFT array substrate 92 and a packaging layer 93. As shown in FIG. 9b, the TFT array substrate 92 comprises a plurality of pixel units 96 defined by gate lines 94 and data lines 95 which intersect each other, and each of the pixel units 96 includes an EL layer 97 and a control circuit 98.

As shown in FIG. 9a, the EL layer 97 includes a metal cathode 971, a pixel electrode (anode) 972 and an organic light emitting material 973 located between the metal cathode 971 and the pixel electrode 972, and the pixel electrode 972 of each of the pixel units 96 comprises at least two first view field pixel electrodes 9721 and at least two second view field pixel electrodes 9722 which are spaced from each other. With respect to the metal cathode 971, the pixel electrode 972 and the organic light emitting material 973, they can be formed by using known materials in related art.

As shown in FIG. 9b, the control circuit 98 of each of the pixel units comprises a first sub-control circuit 981 connected to the first view field pixel electrodes 9721 and a second sub-control circuit 982 connected to the second view field pixel electrodes 9722.

The first sub-control circuit 981 and the second sub-control circuit 982 in FIG. 9b are merely illustrative, and do not represent the true structure of them. For example, the reference numbers 9811, 9812 and 9813 (or 9821, 9822 and 9823) do not necessarily indicate a gate electrode, a source electrode and a drain electrode of one TFT (a switching transistor or a driving transistor), and may belong to different TFTs.

The dual view field OLED display device provided by the embodiment of the invention, by means of changing a sub-pixel electrode for display of one certain view field within one pixel unit in prior art into a plurality of first-view-field pixel electrodes and second-view-field pixel electrodes which are spaced from each other, significantly decreases the width of a single view field pixel electrode, so as to enlarge the visible range of each single-side view field. In such a way, without thinning the thickness of a glass substrate, the enlargement of the visible range of each single-side view field is realized, production costs are reduced, and yield and reliability of substrates are enhanced.

It is to be noted that, the at least two first view field pixel electrodes 9721 and the at least two second view field pixel electrodes 9722 which are spaced from each other are both slim, strip-like electrodes. The at least two first view field pixel electrodes 9721 and the at least two second view field pixel electrodes 9722 which are spaced from each other may be parallel to the gate lines 94, or may be parallel to the data lines 95. Exemplarily, in the dual view field OLED display device provided by the embodiment of the invention, the description will be given with respect to an example in which the at least two first view field pixel electrodes 9721 and the at least two second view field pixel electrodes 9722 which are spaced from each other are parallel to the data lines 95.

Because a plurality of TFT circuits may be used in the OLED display device, the control circuit involved in the present embodiment refers to a part of the TFT circuits for controlling the pixel electrode. For example, the control circuit may include a switching transistor TFT circuit for controlling power-on and power-off of the pixel electrode and a driving transistor TFT circuit for controlling potential fluctuation of the pixel electrode.

Further, as shown in FIG. 9b, in each of the pixel units 96, all of the first view field pixel electrodes 9721 form a first comb-like structure as a whole, all of the second view field pixel electrodes 9722 form a second comb-like structure as a whole, and the branch portions of the first comb-like structure and the branch portions of the second comb-like structure are interlaced with each other. That is, all of the first view field pixel electrodes 9721 and all of the second view field pixel electrodes 9722 exhibit comb-like structures which are spaced from each other as a whole. Preferably, the first view field pixel electrodes 9721 and the second view field pixel electrodes 9722 have a same width; in the embodiment, the width of each of them is "c," and "c" may be in the range of 1-20 μm. Certainly, the first view field pixel electrodes 9721 and the second view field pixel electrodes 9722 may have different widths. Preferably, in each of the pixel units 96, the number of the first view field pixel electrodes 9721 and the number of the second view field pixel electrodes 9722 are equal, and in this case, a better display effect can be achieved. In the embodiment shown in FIG. 9b, in each of the pixel units 96, the number of each of the first view field pixel electrodes 9721 and the number of the second view field pixel electrodes 9722 are each 8; namely, each comb-like electrode has eight branches. Obviously, the present invention is not limited thereto.

The gate electrode 9811 of a switching transistor of the first sub-TFT circuit 9811 and the gate electrode 9821 of a switching transistor of the second sub-TFT circuit 982 are connected to a same gate line; the source electrode 9812 of the switching transistor of the first sub-TFT circuit 981 and the source electrode 9822 of the switching transistor of the second sub-TFT circuit 982 are connected to data lines on two sides of one pixel unit, respectively; and the drain electrode 9813 of a driving transistor of the first sub-TFT circuit 981 is connected to the first view field pixel electrodes 9721, and the drain electrode 9823 of a driving transistor of the second sub-TFT circuit 982 is connected to the second view field pixel electrodes 9722. The connecting relationship between the switching transistor and the driving transistor of the first sub-control circuit, and the connecting relationship between the switching transistor and the driving transistor of the second sub-control circuit, may be configured as desired from prior art on the precise that OLED driving conditions are met, and details are omitted here.

In such a way, pixel electrodes for the same view field share a same data line, a same gate line and a same TFT, so that reduction in the aperture ratio of pixels is limited. Thus, the problem that aperture ratio of the liquid crystal display device is greatly degraded can be avoided.

The dual view barrier 91 may be located above or below the packaging layer 93, and the distance from the dual view barrier 91 to the EL layer 97 may be in the range of 1-20 μm. As shown in FIG. 9a, when the dual view barrier 91 is located above the packaging layer 93, the packaging layer 93 is disposed on the top surface of the EL layer 97; the dual view barrier 91 may be provided directly on the top surface of the packaging layer 93, and the distance "n1" from the top surface of the dual view barrier 91 to the EL layer 97 may be in the range of 1-100 μm.

Figure 9C:
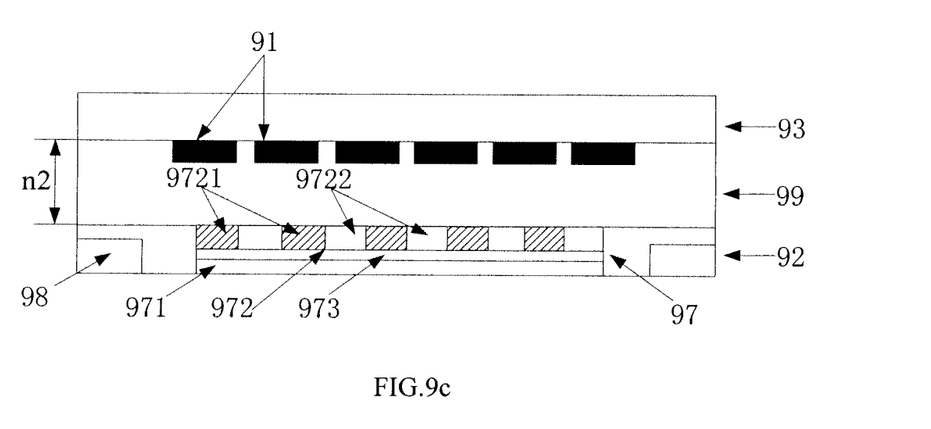
FIG. 9c is a structurally schematic view showing another dual view field OLED display device provided by an embodiment of the invention.

Further, as shown in FIG. 9c, a transparent layer 99 may be further provided between the dual view barrier 91 and the pixel electrodes 972, and the thickness n2 of the transparent layer 99 may be in the range of 1-20 μm. The centerline of the dual view barrier 91 and the centerline of the display region of the display device coincide with each other.

It is to be noted that, the transparent layer 99 may be a vacuum layer or an air layer, and a transparent spacer (e.g. a plastic thin film) may be used to form the transparent layer 99.

Specifically, the structure and connecting relation of the pixel electrodes and control circuits in the above dual view field OLED display device may refer to the pixel electrodes and TFT circuits in the foregoing dual view field liquid crystal display device (further in combination with characteristics of an OLED display in prior art). Beneficial effects produced by various structures have been described in detail in the dual view field liquid crystal display device, and details are omitted here.

It is to be noted that, in the dual view field OLED display device shown in FIG. 9a or FIG. 9c, the centerline of the dual view barrier coincides with the centerline of the display region of the display device. That is, the slit centerline at the center of the dual view barrier coincides with the slit between a first view field pixel electrode and a second view field pixel electrode at the center of the display region of the display device. In addition, the number of slit of the dual view barrier is a half of the sum of the number of the first view field pixel electrodes and the number of the second view field pixel electrodes.

Embodiment 4

A manufacturing method of a dual view field liquid crystal display device provided by the embodiment of the invention may comprise the following steps.

S1001, TFT circuits and pixel electrodes are formed on a lower substrate through patterning processes, wherein the pixel electrode of each of pixel units comprises at least two first view field pixel electrodes and at least two second view field pixel electrodes which are spaced from each other; the 1 circuit of each of the pixel units comprises a first sub-TFT circuit connected to the first view field pixel electrodes and a second sub-TFT circuit connected to the second view field pixel electrodes.

That is, all of the first view field pixel electrodes 4311 are connected to corresponding first sub-TFT circuits 4321, and all of the second view field pixel electrodes 4312 are connected to corresponding second sub-TFT circuits 4322.

S1002, on an upper substrate, a dual view barrier and a color filter are obtained through patterning processes.

S1003, the upper substrate and the lower substrate are assembled together to form a cell, and liquid crystals are filled in the cell.

The manufacturing method of the dual view field liquid crystal display device provided by the embodiment, by means of changing a sub-pixel electrode for display of one certain view field within one pixel unit in prior art into a plurality of first-view-field pixel electrodes and second-view-field pixel electrodes which are spaced from each other, significantly decreases the width of a single view field pixel electrode so as to enlarge the visible range of each single-side view field. In such a way, without thinning the thickness of a glass substrate, the enlargement of the visible range of each single-side view field can be realized, production costs are reduced, and yield and reliability of substrates are enhanced.

It is to be noted that, the at least two first view field pixel electrodes and the at least two second view field pixel electrodes which are spaced from each other are both slim, strip-like electrodes. The at least two first view field pixel electrodes and the at least two second view field pixel electrodes which are spaced from each other may be parallel to gate lines, or may be parallel to data lines. Exemplarily, in the dual view field liquid crystal display device provided by the embodiment of the invention, description will be given to an example in which the at least two first view field pixel electrodes and the at least two second view field pixel electrodes which are spaced from each other are parallel to the data lines.

For example, in each of the pixel units, all of the first view field pixel electrodes form a first comb-like structure as a whole, all of the second view field pixel electrodes form a second comb-like structure as a whole, and the branch portions of the first comb-like structure and the branch portions of the second comb-like structure are interlaced with each other. That is, all of the first view field pixel electrodes and all of the second view field pixel electrodes exhibit comb-like structures which are spaced from each other as a whole. Preferably, the first view field pixel electrodes and the second view field pixel electrodes have a same width; the width of each of them may be in the range of 1-20 μm. Certainly, the first view field pixel electrodes and the second view field pixel electrodes may have different widths. Preferably, in each of the pixel units, the number of the first view field pixel electrodes and the number of the second view field pixel electrodes are equal, and in this case, a better display effect can be achieved.

Further, the gate electrode of the first sub-TFT circuit and the gate electrode of the second sub-TFT circuit are connected to a same gate line; the source electrode of the first sub-TFT circuit and the source electrode of the second sub-TFT circuit are connected to data lines on two sides of one pixel unit, respectively; and the drain electrode of the first sub-TFT circuit is connected to the first view field pixel electrodes, and the drain electrode of the second sub-TFT circuit is connected to the second view field pixel electrodes.

In such a way, pixel electrodes for the same view field share a same data line, a same gate line and a same TFT, so that reduction in the aperture ratio of pixels is limited. Thus, the problem that the aperture ratio of the liquid crystal display device is greatly degraded can be avoided.

Still Further, the dual view barrier may be located above or below the color filter of the upper substrate. The distance from the dual view barrier to the color filter may be in the range of 1-100 μm.

When the dual view barrier is located above the color filter, steps of the manufacturing method of the dual view field liquid crystal display device may be as follows.

S1101, TFT circuits and pixel electrodes are formed on a lower substrate through patterning processes, wherein the pixel electrode of each of pixel units comprises at least two first view field pixel electrodes and at least two second view field pixel electrodes which are spaced from each other; the TFT circuit of each of the pixel units comprises a first sub-TFT circuit connected to the first view field pixel electrodes and a second sub-TFT circuit connected to the second view field pixel electrodes.

S1102, after a color filter is formed on an upper substrate, a transparent layer with a thickness in the range of 1-100 μm may be formed on the color filter.

S1103, a dual view barrier is formed on the transparent layer.

S1104, the upper substrate and the lower substrate are assembled together to form a cell, and liquid crystals are filled in the cell.

When the dual view barrier is located below the color filter, the dual view barrier may be located at the top surface of a TFT array substrate.

As such, without reducing the thickness of a glass substrate, enlargement of the visible range of a single view field is realized, and sturdiness of the glass substrate is guaranteed. On the other hand, pixel electrodes for the same view field share a same data line, a same gate line and a same TFT, so that reduction in the aperture ratio of pixels is limited. Thus, the problem that the aperture ratio of the liquid crystal display device is greatly degraded is avoided.

Further, the centerline of the dual view barrier may coincide with the centerline of the display region of the display device.

The manufacturing method of the dual view field liquid crystal display device provided by the embodiment, by means of changing a sub-pixel electrode for display of one certain view field within one pixel unit in prior art into a plurality of first-view-field pixel electrodes and second-view-field pixel electrodes which are spaced from each other, significantly decreases the width of a single view field pixel electrode, so as to enlarge the visible range of each single-side view field. In such a way, without thinning the thickness of a glass substrate, enlargement of the visible range of each single-side view field is realized, production costs are reduced, and yield and reliability of substrates are enhanced.

Embodiment 5

A manufacturing method of a dual view field OLED display device provided by the present embodiment comprises the following steps.

S1201, control circuits are obtained on a lower substrate through patterning processes.

S1202, an EL layer is formed on the lower substrate with the control circuits formed thereon, wherein the EL layer includes a metal cathode, a pixel electrode and an organic light emitting material located between the metal cathode and the pixel electrode; the pixel electrode of each of pixel units comprises at least two first view field pixel electrodes and at least two second view field pixel electrodes which are spaced from each other; the control circuit of each of the pixel units comprises a first sub-control circuit connected to the first view field pixel electrodes and a second sub-control circuit connected to the second view field pixel electrodes.

S1203, a dual view barrier is obtained through patterning processes on an upper substrate.

S1204, the upper substrate is made to cover the lower substrate.

The manufacturing method of the dual view field OLED display device provided by the embodiment, by means of changing a sub-pixel electrode for display of one certain view field within one pixel unit in prior art into a plurality of first-view-field pixel electrodes and second-view-field pixel electrodes which are spaced from each other, significantly decreases the width of a single view field pixel electrode, so as to enlarge the visible range of each single-side view field. In such a way, without thinning the thickness of a glass substrate, enlargement of the visible range of each single-side view field is realized, production cost is reduced, and yield and reliability of substrates are enhanced.

It is to be noted that, the at least two first view field pixel electrodes and the at least two second view field pixel electrodes which are spaced from each other are both slim, strip-like electrodes. The at least two first view field pixel electrodes and the at least two second view field pixel electrodes which are spaced from each other may be parallel to gate lines, or may be parallel to data lines. Exemplarily, in the dual view field OLED display device provided by the embodiment of the invention, description will be given to an example in which the at least two first view field pixel electrodes and the at least two second view field pixel electrodes which are spaced from each other are parallel to the data lines.

Because a plurality of TFT circuits may be comprised in the OLED display device, the control circuit involved in the embodiment of the invention refers to part of the TFT circuits for controlling the pixel electrodes. Specifically, the control circuit may include a switching transistor TFT circuit for controlling power-on and power-off of the pixel electrode and a driving transistor TFT circuit for controlling potential fluctuation of the pixel electrode in a pixel unit.

Specifically, in each of the pixel units, all of the first view field pixel electrodes form a first comb-like structure as a whole, all of the second view field pixel electrodes form a second comb-like structure as a whole, and the branch portions of the first comb-like structure and the branch portions of the second comb-like structure are interlaced with each other. That is, all of the first view field pixel electrodes and all of the second view field pixel electrodes exhibit comb-like structures which are spaced from each other as a whole. Preferably, the first view field pixel electrodes and the second view field pixel electrodes have a same width; in the embodiment, the width of each of them may be in the range of 1-20 µm. Certainly, the first view field pixel electrodes and the second view field pixel electrodes may have different widths. Preferably, in each of the pixel units, the number of the first view field pixel electrodes and the number of the second view field pixel electrodes are equal, and in this case, a better display effect can be achieved.

Further, the gate electrode of a switching transistor of the first sub-TFT circuit and the gate electrode of a switching transistor of the second sub-TFT circuit are connected to a same gate line; the source electrode of the switching transistor of the first sub-TFT circuit and the source electrode of the switching transistor of the second sub-TFT circuit are connected to data lines on two sides of one pixel unit, respectively; and the drain electrode of a driving transistor of the first sub-TFT circuit is connected to the first view field pixel electrodes, and the drain electrode of a driving transistor of the second sub-TFT circuit is connected to the second view field pixel electrodes.

In such a way, pixel electrodes for the same view field share a same data line, a same gate line and a same TFT, so that reduction in the aperture ratio of pixels is limited. Thus, a problem that the aperture ratio of the liquid crystal display device is greatly degraded can be avoided.

Further, a manufacturing method of a dual view field OLED display device provided by the present embodiment may comprise the following steps.

S1301, control circuits are formed on a lower substrate through patterning processes.

S1302, an EL layer is formed on the lower substrate with the control circuits formed thereon, wherein the EL layer includes a metal cathode, a pixel electrode and an organic light emitting material located between the metal cathode and the pixel electrode; the pixel electrode of each of pixel units comprises at least two first view field pixel electrodes and at least two second view field pixel electrodes which are spaced from each other; the control circuit of each of the pixel units comprises a first sub-control circuit connected to the first view field pixel electrodes and a second sub-control circuit connected to the second view field pixel electrodes.

S1303, after the EL layer is formed on the lower substrate, a transparent spacer layer which may have a thickness in the range of 1-100 µm is formed on the EL layer.

S1304, a dual view barrier is formed on the transparent spacer layer.

S1305, the upper substrate is made to cover the lower substrate.

Further, the centerline of the dual view barrier may coincide with the centerline of the display region of the display device.

It is to be noted that, the upper substrates involved in the manufacturing methods of the dual view field OLED display devices provided by the embodiment of the invention refer to packaging layers for packaging the OLED display devices.

The manufacturing method of the dual view field OLED display device provided by the embodiment of the invention, by means of changing a sub-pixel electrode for display of one certain view field within one pixel unit in prior art into a plurality of first-view-field pixel electrodes and second-view-field pixel electrodes which are spaced from each other, significantly decreases the width of a single view field pixel electrode so as to enlarge the visible range of each single-side view field. In such a way, without thinning the thickness of a glass substrate, enlargement of the visible range of each single-side view field is realized, production costs are reduced, and yield and reliability of substrates are enhanced.

Embodiment 6

The embodiment of the invention provides a 3D display device and a manufacturing method thereof, which uses the array substrate with a "micro-pixel" structure as stated in Embodiment 1.

In terms of basic principle, the principle of a dual view display and the principle of a 3D display are the same, and both focus on discrimination between different kinds of view field display information. The only difference lies in that, what to be discriminated by the 3D display are view field signals for a left eye and a right eye (which are to be received by different eyes of the same viewer), and what to be discriminated by the dual view display are a first view field signal and a second view field signal (which are to be received by different viewers). Therefore, it is possible that the dual view field display implementation methods in the foregoing embodiments and the array substrates in the above embodiments are used so as to implement the 3D displays. Thus, the present embodiment provides a 3D display device and a manufacturing method thereof.

The 3D display device comprises: a display panel and a grating layer disposed over the display panel; the display panel includes the array substrate as stated in Embodiment 1.

Further, the display panel may be a liquid crystal panel;

The liquid crystal panel may include an array substrate, a color filter substrate and liquid crystals filled between the array substrate and the color filter substrate;

The color filter substrate may include a transparent substrate and a color filter provided thereon;

The array substrate is the array substrate as stated in Embodiment 1.

Further, the display panel may also be an OLED panel;

The OLED panel includes an array substrate and a packaging layer, wherein the array substrate includes a plurality of pixel units defined by gate lines and data lines which intersect each other, each of the pixel units includes an electroluminescence (EL) layer and a control circuit, the EL layer includes a metal cathode, a pixel electrode and an organic light emitting material located between the metal cathode and the pixel electrode;

The pixel electrode of each of pixel units comprises at least two first view field pixel electrodes and at least two second view field pixel electrodes which are spaced from each other;

The control circuit of each of the pixel units comprises a first sub-control circuit connected to the first view field pixel electrodes and a second sub-control circuit connected to the second view field pixel electrodes.

The manufacturing method of the 3D display device and the specific structure of the 3D display device provided by the embodiment of the invention may refer to the realization solutions of the dual view field display devices in the foregoing embodiments 2, 3, 4 and 5, and details are omitted here.

The 3D display device provided by the embodiment of the invention, by means of changing a sub-pixel electrode for display of one certain view field within one pixel unit in prior art into a plurality of first pixel electrodes and second pixel electrodes which are spaced from each other, significantly decreases the width of a single view field pixel electrode. The decreasing of the width of the single view field pixel electrode can reduce the thickness of the grating layer. When the grating layer is a parallax barrier, reduction in the thickness of the parallax barrier allows the parallax barrier to be produced directly within the cell of the display device, without the need of additionally producing a layer of parallax barrier on a display device which has formed by cell-assembling. When the grating layer is a lens grating, decreasing of the thickness of the lens grating allows an arch height of a columnar lens to be reduced. As such, use of an existing manufacturing process can meet production requirements of the product, and addition of a new process or use of a new production equipment can be avoided, thereby reducing the production cost.

The foregoing are merely exemplary embodiments of the invention, but are not used to limit the protection scope of the invention. The protection scope of the invention is defined by appended claims.

The invention claimed is:

1. An array substrate, comprising a plurality of pixel units defined by gate lines and data lines which intersect each other, each of the pixel units including an organic electroluminescence (EL) layer and a thin film transistor (TFT) circuit, wherein
the EL layer includes a metal cathode, a pixel electrode configured for an anode and an organic light emitting material located between the metal cathode and the pixel electrode;
the pixel electrode of each of the pixel units comprises at least two first pixel electrodes and at least two second pixel electrodes, which are spaced from each other;
the TFT circuit of each of the pixel units comprises a first sub-TFT circuit connected to the first pixel electrodes and a second sub-TFT circuit connected to the second pixel electrodes; and
a width of the first pixel electrodes is different from that of the second pixel electrodes.

2. The array substrate claimed as claim 1, wherein in each of the pixel units, the first pixel electrodes form a first comb-like structure as a whole, the second pixel electrodes form a second comb-like structure as a whole, and branch portions of the first comb-like structure and branch portions of the second comb-like structure are disposed to be interlaced with each other.

3. The array substrate claimed as claim 1, wherein a gate electrode of the first sub-TFT circuit and a gate electrode of the second sub-TFT circuit are connected to a same gate line; a source electrode of the first sub-TFT circuit and a source electrode of the second sub-TFT circuit are connected to two different data lines, respectively; and a drain electrode of the first sub-TFT circuit is connected to the first pixel electrodes, and a drain electrode of the second sub-TFT circuit is connected to the second pixel electrodes.

4. The array substrate claimed as claim 1, wherein the widths of the first pixel electrodes and the second pixel electrodes are in the range of 1-20 μm.

5. A dual view display device, comprising: an organic light-emitting diode (OLED) display panel and a dual view barrier provided over the OLED display panel, wherein the OLED display panel includes the array substrate claimed as claim 1.

6. The dual view display device claimed as claim 5, wherein a centerline of the dual view barrier coincides with a centerline of a display region of the display panel.

7. The dual view display device claimed as claim 5, wherein the OLED panel further comprises a packaging layer, and the dual view barrier is located above or below the packaging layer.

8. The dual view display device claimed as claim 7, wherein the dual view barrier is located below the packaging layer, and a transparent layer of a thickness in the range of 1-100 μm is provided between the dual view barrier and the pixel electrode.

9. A manufacturing method of a dual view field OLED display device, comprising:

forming control circuits on a lower substrate through patterning processes;

forming an EL layer on the lower substrate with the control circuits formed thereon, wherein the EL layer includes a metal cathode, a pixel electrode configured for an anode and an organic light emitting material located between the metal cathode and the pixel electrode; the pixel electrode of each of pixel units comprises at least two first pixel electrodes and at least two second pixel electrodes, which are spaced from each other; the control circuit of each of the pixel units comprises a first sub-control circuit connected to the first pixel electrodes and a second sub-control circuit connected to the second pixel electrodes;

forming a dual view barrier on an upper substrate through patterning processes; and covering the lower substrate with the upper substrate;

wherein a width of the first pixel electrodes is different from that of the second pixel electrodes.

10. The manufacturing method claimed as claim 9, wherein in each of the pixel units, all of the first pixel electrodes form a first comb-like structure as a whole, all of the second pixel electrodes form a second comb-like structure as a whole, and branch portions of the first comb-like structure and branch portions of the second comb-like structure are interlaced with each other.

11. The manufacturing method claimed as claim 9, wherein a gate electrode of a switching transistor of the first sub-TFT circuit and a gate electrode of a switching transistor of the second sub-TFT circuit are connected to a same gate line; a source electrode of the switching transistor the first sub-TFT circuit and a source electrode of the switching transistor of the second sub-TFT circuit are connected to data lines on two sides of one pixel unit, respectively; and a drain electrode of a driving transistor of the first sub-TFT circuit is connected to the first pixel electrodes, and a drain electrode of a driving transistor of the second sub-TFT circuit is connected to the second pixel electrodes.

12. The manufacturing method claimed as claim 9, wherein the dual view barrier is located above or below the packaging layer, and a distance from the dual view barrier to the EL layer is in the range of 1-100 μm.

13. The manufacturing method claimed as claim 9, wherein a centerline of the dual view barrier coincides with a centerline of a display region of the display panel.

14. The manufacturing method claimed as claim 9, wherein the widths of the first pixel electrodes and the second pixel electrodes are in the range of 1-20 μm.

* * * * *